US011963307B2

(12) United States Patent
Doyle et al.

(10) Patent No.: US 11,963,307 B2
(45) Date of Patent: Apr. 16, 2024

(54) VACUUM-ASSISTED BGA JOINT FORMATION

(71) Applicant: International Business Machines Corporation, Armonk, NY (US)

(72) Inventors: Matthew Doyle, Chatfield, MN (US); Thomas W. Liang, Rochester, MN (US); Layne A. Berge, Rochester, MN (US); John R. Dangler, Rochester, MN (US); Jason J. Bjorgaard, Rochester, MN (US); Kyle Schoneck, Rochester, MN (US); Matthew A. Walther, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/216,863

(22) Filed: Mar. 30, 2021

(65) Prior Publication Data

US 2022/0322540 A1 Oct. 6, 2022

(51) Int. Cl.
*B23K 1/00* (2006.01)
*B23K 3/06* (2006.01)
(Continued)

(52) U.S. Cl.
CPC ......... *H05K 3/3478* (2013.01); *B23K 1/0008* (2013.01); *B23K 3/0623* (2013.01);
(Continued)

(58) Field of Classification Search
USPC ......................................................... 228/103
See application file for complete search history.

(56) References Cited

U.S. PATENT DOCUMENTS 3,268,653 A * 8/1966 McNutt ................ H05K 3/0094
439/85
4,779,565 A * 10/1988 Young ................... H01L 21/486
118/712
(Continued)

FOREIGN PATENT DOCUMENTS

JP       57190767 A   * 11/1982 ............. B23K 1/085
JP       01309396 A   * 12/1989
(Continued)

OTHER PUBLICATIONS

"Overview Vacuum Hole Filling," Adeon, Printed Mar. 30, 2021, 6 pages, https://www.adeon.nl/products/hole-filling-systems/vacuum-hole-filling.

(Continued)

*Primary Examiner* — Erin B Saad
*Assistant Examiner* — Carlos J Gamino
(74) *Attorney, Agent, or Firm* — Peter J. Edwards

(57) ABSTRACT

A ball-grid-array component of a ball-grid array assembly is analyzed prior to reflow. A predicted warping pattern of the ball-grid-array component that is likely to occur during reflow is predicted based on the analyzing. A solder ball ball-grid-array defect that could be caused by the predicted warping pattern is predicted. An initial via suction pattern to mitigate the ball-grid-array defect is assigned. A vacuum head is applied to a via in the ball-grid-array assembly. The solder ball is located at the opposite end of the via from the vacuum head. Suction is applied to the via based on the via suction pattern. The suction draws a portion of the solder ball into the via during reflow.

20 Claims, 6 Drawing Sheets

(51) Int. Cl.
*B23K 3/08* (2006.01)
*H05K 3/34* (2006.01)
*B23K 101/36* (2006.01)

(52) U.S. Cl.
CPC ............. *B23K 3/08* (2013.01); *H05K 3/3436* (2013.01); *B23K 2101/36* (2018.08); *H05K 2201/09136* (2013.01); *H05K 2203/041* (2013.01); *H05K 2203/082* (2013.01)

(56) References Cited

U.S. PATENT DOCUMENTS

| | | | | |
|---|---|---|---|---|
| 5,275,330 | A * | 1/1994 | Isaacs | H05K 3/3485 257/E21.511 |
| 5,478,009 | A | 12/1995 | Interrante et al. | |
| 5,489,750 | A * | 2/1996 | Sakemi | H05K 3/3436 361/767 |
| 5,641,946 | A | 6/1997 | Shim | |
| 5,753,070 | A * | 5/1998 | Dandia | H01L 21/6833 269/21 |
| 5,802,712 | A * | 9/1998 | Sakai | H05K 3/3436 29/840 |
| 5,907,903 | A * | 6/1999 | Ameen | H01R 12/52 361/744 |
| 6,037,665 | A * | 3/2000 | Miyazaki | H01L 23/49827 257/E21.511 |
| 6,088,914 | A | 7/2000 | Variot et al. | |
| 6,276,055 | B1 * | 8/2001 | Bryan | H05K 3/0094 29/853 |
| 6,443,351 | B1 | 9/2002 | Huang et al. | |
| 6,444,497 | B2 | 9/2002 | Wensel et al. | |
| 6,461,136 | B1 * | 10/2002 | Gruber | H05K 3/4602 118/301 |
| 6,750,549 | B1 | 6/2004 | Chandran et al. | |
| 7,546,941 | B2 | 6/2009 | No et al. | |
| 8,604,614 | B2 * | 12/2013 | Kwon | H01L 25/50 257/737 |
| 8,911,242 | B2 * | 12/2014 | Jeon | H01R 13/2442 439/66 |
| 9,385,098 | B2 * | 7/2016 | Zhang | H01L 23/49816 |
| 9,842,818 | B2 | 12/2017 | Li et al. | |
| 9,960,105 | B2 * | 5/2018 | Jiang | H01L 23/49816 |
| 11,432,372 | B2 * | 8/2022 | Cheng | H01L 24/81 |
| 2003/0096448 | A1 | 5/2003 | Kever | |
| 2005/0087588 | A1 * | 4/2005 | Weigler | H05K 3/3457 228/264 |
| 2007/0281473 | A1 * | 12/2007 | Clark | H01L 21/76898 257/E21.597 |
| 2008/0057691 | A1 * | 3/2008 | Dando | H01L 21/76898 257/E21.597 |
| 2008/0274569 | A1 | 11/2008 | Tsao et al. | |
| 2009/0294974 | A1 * | 12/2009 | Leung | H01L 25/50 438/455 |
| 2011/0079632 | A1 * | 4/2011 | Chey | B23K 3/0638 228/33 |
| 2018/0005972 | A1 | 1/2018 | Hossain et al. | |
| 2019/0254174 | A1 * | 8/2019 | Tanaka | H05K 13/0465 |
| 2022/0319867 | A1 * | 10/2022 | Doyle | H05K 3/4007 |
| 2023/0026967 | A1 | 1/2023 | Williamson et al. | |

FOREIGN PATENT DOCUMENTS

| | | |
|---|---|---|
| JP | 10135276 A | 5/1998 |
| KR | 20030001029 A | 1/2003 |

OTHER PUBLICATIONS

"Vertical vacuum plugging machine," Mass, PCB in Progress, Printed Mar. 26, 2021, 2 pages https://www.mass-pcb.de/viaholefilling.html.

Yeary et al., "Variables Affecting Bare PCB Warpage During Reflow; A Study on Support Methods and Temperature Uniformity," PCB West 2017 Conference & Exhibition, 2017, 46 pages, http://akrometrix.com/wp-content/uploads/2016/02/Variables-Affecting-Bare-PCB-Warpage-During-Reflow.pdf.

Lee, "Root Cause Failure Analysis of Printed Circuit Board Assemblies," Wisconsin Chapter SMTA, Mar. 8, 2011, 62 pages.

"Got problems? Let US find the solution!," Creative Electron, the X-Ray People, Printed Mar. 26, 2021, 5 pages.

Doyle et al., "Feature Selection Through Solder-Ball Population," U.S. Appl. No. 17/216,932, filed Mar. 30, 2021.

List of IBM Patents or Patent Applications Treated as Related, Dated Mar. 29, 2021, 2 pages.

* cited by examiner

VACUUM-ASSISTED BGA JOINT FORMATION

BACKGROUND

The present disclosure relates to ball grid arrays, and more specifically, to the reliability of joints formed using ball gird arrays.

Ball grid arrays are often used to attach components such as processor packages, memory chips, systems on a chip, and others to printed circuit boards. In a ball-grid array, a grid of solder balls are arranged on a printed circuit board and the component is placed on the grid. The assembly is then heated to a temperature at which the solder in the solder balls begins to melt, a process known as reflow. During reflow, the liquid solder balls temporarily adhere to both the printed circuit board and the component that is being attached. When the assembly is allowed to cool, the solder balls solidify, the temporary adhesion between the component and the printed circuit board becomes permanent. At this point, the solder balls provide a structural and electrical connection between the component and the printed circuit board.

SUMMARY

Some embodiments of the present disclosure can be illustrated as a method comprising analyzing a ball-grid-array component of a ball-grid-array assembly prior to reflow. The method also comprises predicting a predicted warping pattern of the ball-grid-array component that is likely to occur during reflow, based on the analyzing. The method also comprises predicting a solder ball ball-grid-array defect that could be caused by the predicted warping pattern. The method also comprises assigning an initial via suction pattern to mitigate the ball-grid-array defect. The method also comprises applying a vacuum head to a via in the ball-grid-array assembly. The solder ball is located at the opposite end of the via. The method also comprises applying suction to the via based on the via suction pattern. The suction draws a portion of the solder ball into the via during reflow.

Some embodiments of the present disclosure can also be illustrated as a system that comprises a processor and a memory in communication with the processor. The memory contains program instructions that are configured to cause the processor to perform the above-described method when the program instructions are executed by the processor.

Some embodiments of the present disclosure can also be illustrated as a computer program product that comprises a computer readable storage medium having program instructions embodied therewith. The program instructions are executable by a computer to cause the computer to perform the steps of the above-described method.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
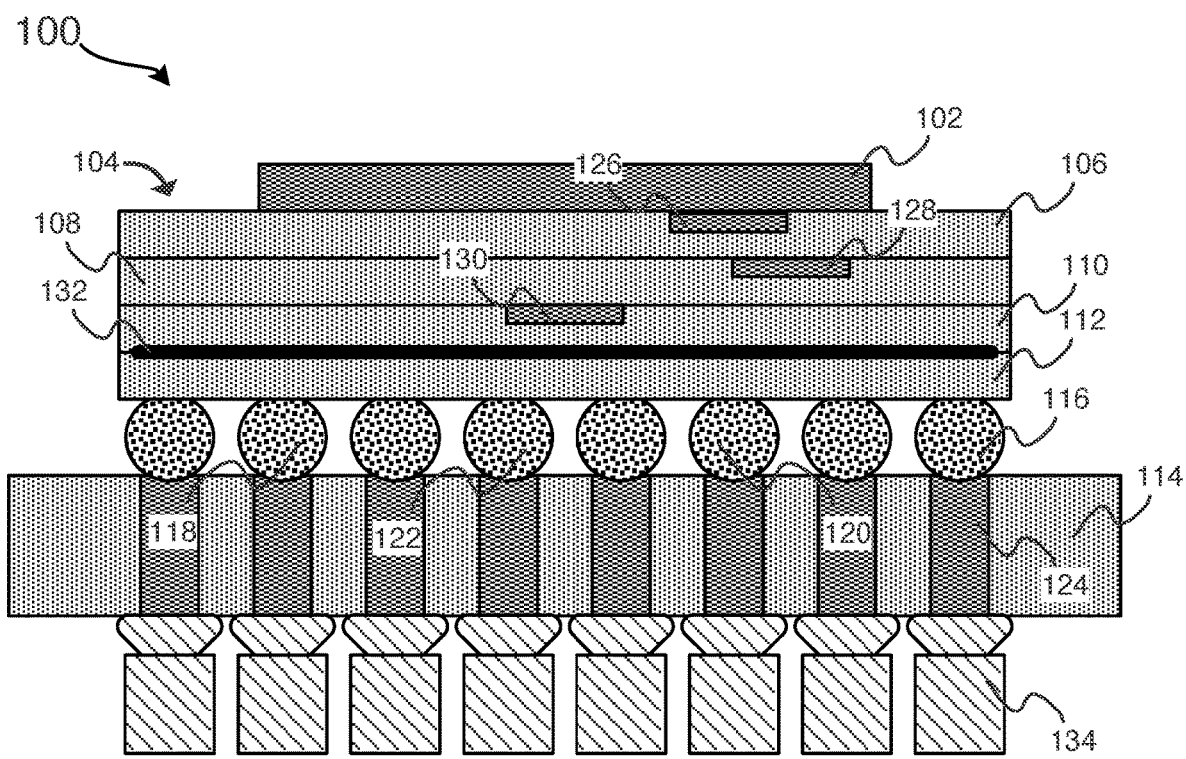
FIG. 1A depicts a first view of a ball-grid-array assembly before reflow has begun.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to ball grid arrays, and more specifically, to the reliability of joints formed using ball gird arrays.

While the present disclosure is not necessarily limited to such applications, various aspects of the disclosure may be appreciated through a discussion of various examples using this context.

Ball grid arrays (sometimes referred to herein as "BGAs") are useful for attaching ball-grid-array components together in a ball-grid-array assembly. For example, common BGA components include printed circuit boards (sometimes referred to herein as "PCBs"), microprocessor chips memory chips, or others. In a BGA, a pattern of solder balls (typically a grid) is placed on one of the components (often a PCB, such as a motherboard). Another BGA component, such as a microprocessor, memory chip, or another PCB, is then placed on the solder balls. Because the solder balls contain a sticky resin, a temporary attachment is then formed between the solder balls and both the BGA components. During a process called reflow, the solder balls are heated up until the solder therein melts and attaches to BGA components. The solder balls are then allowed to cool at which point they harden again.

When reflow in a BGA assembly is successful, the hardened solder balls within the BGA assembly not only serve as a structural attachment between the BGA components, but also sometimes function as an electrical connection as well. For example, the solder balls may be placed on electrical contacts (e.g., contact pads, electroplated vias, conductive pins, etc.) on two PCBs of a BGA assembly. After reflow, the solder balls are permanently connected to those electrical contacts, thus allowing communication between the contacts on one PCB and the contacts on the other PCB.

Typically, each solder ball in a ball grid array forms a separate electrical connection between the each BGA component. Thus, if one solder ball fails to connect properly (e.g., does not form a connection), the features of the BGA assembly associated with that connection may not work. Similarly, if a solder ball does not adhere to a contact pad with a sufficient surface area, the features associated with that electrical connection may be negatively affected by the connection's reduced ability to transmit power or data. On the other hand, if a solder ball accidentally connects to two electrical contacts on either BGA component, a short may be created, causing the features related to those contacts to not function properly.

In typical BGA assemblies, the ultimate effects of a BGA defect depend both on the type of defect and the features associated with that defect. In some instances, a single connection not functioning properly may be undesired, but not critical. For example, if a solder-ball connection between a processor package and the PCB relates to transferring data from the system memory to the processor, a connection with slightly less surface area than normal may reduce the peak performance of the processor in certain workloads, but the overall PCB assembly device may still be marketable.

In other instances, however, a single connection not functioning properly may lead to critical flaws in the PCB assembly. For example, if that reduced-surface-area connection instead relates to the power delivery to the processor, the processor may be critically unstable at normal operating voltages. Similarly, if a connection relates to transferring data from the system memory to the processor is completely missing (for example, if the solder ball associated with the connection did not adhere to both electrical contacts), the processor may be incapable of fetching data from certain areas of the system memory.

Due in part to this variability, the ultimate effects of BGA defects for a particular PCB assembly can be difficult to discover until after reflow is completed. Further, due to the permanent connection between the BGA components, it can be difficult or completely infeasible to repair these BGA defects once discovered. For these reasons, significant benefits can be realized by identifying potential sources of BGA defects before reflow and eliminating those potential sources of defects before reflow is performed.

One significant source of BGA defects is warping of the printed circuit boards and other components during the reflow process. Warping during reflow occurs due in large part to the high heats to which the BGA solder balls are heated to reach melting conditions. This heat can cause the layers and internal components of on either side of a BGA connection (e.g., a motherboard PCB and a processor assembly PCB) to expand. However, PCBs and other BGA components are neither uniform with respect to other components (thus, two PCBs in a BGA connection may differ significantly from each other) or internally (thus, one area of a PCB may have significant structural differences as compared to another area of that PCB). For this reason, PCBs and other BGA components expand at different rates compared to each other and throughout themselves. This can cause a PCB and the connected components to warp during reflow.

For example, a typical processor assembly includes one or more processor dies mounted to a small PCB. That small PCB may then be attached to a motherboard PCB in a BGA connection. However, the internal structure of the small PCB may cause it to warp during reflow. Similarly, because the internal structure of the motherboard PCB may differ significantly, the motherboard PCB may warp in a different way during reflow, or may not warp significantly. For this reason, sections of the smaller PCB may pull away from or be pushed towards the motherboard PCB during reflow.

If two BGA components (e.g., a processor-assembly PCB and a motherboard PCB) warp towards each other at a particular location during reflow, the BGA solder balls between those two BGA components at that location can become squished between the BGA components, widening their footprint. With sufficient warping, adjacent solder balls may touch each other, creating an electrical short between the two solder balls and all four associated electrical connections. This is analogous to using a single wire to provide two completely separate connections.

If two BGA components warp away from each other at a particular location, on the other hand, the BGA solder balls at that location can become stretched, or may even be pulled away completely from one of the BGA components. Stretching a solder-ball connection can significantly reduce the BGA surface area through which the data or power of that connection flows. This is analogous to using a smaller-diameter wire than intended to provide an electrical connection. This can not only reduce the connection's ability to transfer power and data, but can also lead to structural instability.

With sufficient warping, the solder ball may not form a connection at all, which is analogous to cutting a wire that provides the electrical connection. Sometimes, this connection may be reformed after reflow when the BGA assembly cools and warping reverses and the disconnected solder ball is pushed into both BGA components again. However, because this typically occurs after cooling, the associated connection is not permanent or structurally stable, which can cause it to deteriorate over time (due to, for example, structural shock or metal-oxide formation at the connection). These issues do not occur immediately, and thus some BGA defects may not be discovered until the BGA assembly is incorporated into a product and shipped.

For these reasons, it can be beneficial to accurately predict warping of BGA components before reflow is performed. Multiple properties of a BGA assembly can affect warping, particularly with respect to properties of PCBs that are connected in the BGA. For example, larger, more complex PCBs tend to have more significant warpage issues and more complex warpage patterns. PCBs with relatively high numbers of layers tend to warp more than PCBs with relatively low numbers of layers, and PCBs with a higher surface area in the plane of the connection (e.g., the plane of the grid of solder balls) tend to warp more as well. Components attached to the surface of the PCB (e.g., processor dies, memory chips) can also impact the warpage of the PCB. Finally, PCBs that are already partially warped before reflow (for example, PCBs that warped as a result of a lamination process) have a tendency to warp further during reflow.

Then internal structure of a PCB can also have a significant impact on the PCB. For example, if the top substrate layers of a PCB are significantly thicker (or thinner) than the bottom layers, warping is more likely. Similarly, if the copper wires etched throughout the top layers of the PCB are thicker (or thinner) than the bottom layers, warping is also more likely. Inconsistencies in the density of copper density throughout a PCB can also have a significant impact on warping. For example, if a PCB has a lot of copper connections running through one section of the PCB (e.g., in one or more layers at near the edge of the PCB), the PCB may be more likely to expand in that section as compared to other sections, causing warping throughout the PCB.

As such, several different aspects of a BGA assembly's design can contribute to the warpage of that BGA assembly during reflow. For this reason, significant efforts are sometimes undergone to analyzing these aspects of a BGA assembly prior to reflow in order to predict warpage. For example, BGA components (e.g., memory chips and PCBs) can be analyzed by laser time-of-flight testing to determine the warpage levels of the BGA components prior to reflow. This warpage can be used to estimate the extent of warpage that the BGA component is likely to undergo during reflow, and how sensitive the BGA component is to other sources of warpage.

BGA components can also be analyzed for other sources of warpage. For example, a PCB's design can be analyzed to determine how symmetrical the layer thicknesses are (e.g., whether the substrates at the top of the PCB are the same thickness as the substrates at the bottom of the PCB), and note whether any asymmetries may increase the tendency of the PCB to warp. Similarly, the distribution of copper densities in the PCB can be analyzed, as can the locations and properties of components already attached to the PCB.

If this analysis determines that a BGA component is likely to warp during reflow, and the design of that BGA component has features that contribute to that tendency, it is sometimes beneficial to alter the design of the BGA component to address that tendency. For example, if the copper wires in the lower layers of a PCB are thicker than the wires in the upper layers of the PCB, the design may be altered to incorporate thicker copper in the upper layers as well. Similarly, the substrate layers of a PCB can be thickened (or thinned) to address asymmetries in the thickness of substrate layers. Further, if design analysis determines that the density of copper wires in a PCB is asymmetrical (e.g., if the center of the PCB has a large amount of copper wires, but the edges of the PCB have very little copper), non-functional copper can be added to the PCB design to account for those asymmetries in a technique known as thieving.

In some instances, the above mitigations may be sufficient to reduce warping to an acceptable level. However, the above mitigations do affect the cost of the design, and do sometimes require investment of time and money to incorporate into the design. However, some of these mitigations may not be applicable. For example, the design of a PCB may already feature symmetrical layers, and thus altering the layers to achieve symmetry would not be available to mitigate potential warping.

Further, even when all of the above mitigations are applicable, design analysis may determine that the mitigations are unlikely to be sufficient to reduce warping to an acceptable level. In these instances, more significant BGA-component redesign efforts may be necessary in order to avoid a level of warping that would result in a high failure rate. These redesign efforts may include changing the internal wiring of the BGA component, changing the number of layers, the composition of layers, the size of the component, or others. These redesign efforts may be tremendously costly, and thus it is preferred to avoid them where possible.

For the above reasons, systems and methods that can mitigate a tendency of a BGA component to warp during reflow are desired in the industry. Some systems and methods of the previous disclosure address the issues discussed above by incorporating through-hole vias below the solder balls of a ball grid array on one or more BGA components. These through-hole vias may be attached to a source of suction which can increase or decrease the pressure inside the via during reflow. For example, suction heads (e.g., vacuum heads) may be placed against the bottom of the vias (i.e., opposite the solder balls) to control the pressure in the vias. A suction pattern that corresponds to the predicted warpage for the BGA assembly can then be developed for the vias to mitigate the effects of the warpage on the solder balls.

For example, if warpage of the BGA assembly is expected to reduce the space between the two BGA components at a particular section during reflow, the solder balls at that section may be at risk of being squished together, causing a short. To mitigate this warpage, some embodiments of the present disclosure may apply suction to the vias on which those solder balls are placed to create a negative pressure inside those vias. That negative pressure may draw some of the solder into the via during reflow, causing the solder ball between the BGA components to shrink. The amount of suction applied to these vias may be based on the warpage pattern; if the warpage pattern is expected to cause a short if the solder balls are larger than a threshold percentage (e.g., 90%) of their original size, a vacuum head may apply a sufficient amount of suction to draw at least a complementary percentage (e.g., 10%) of the solder into the vias.

Similarly, if warpage of the BGA assembly is expected to increase the space between two BGA components at a particular section during reflow, the solder balls at that section may be at risk of stretching or disconnecting, causing reduced throughput, structural instability, increase risk of metal-oxide corrosion, or complete lack of electrical connection. To mitigate this warpage, some embodiments of the present disclosure may apply a larger-than-normal solder ball at this particular section. However, at reflow, suction may be initially applied to the vias, drawing some of the solder into the via. Thus, at the beginning of reflow, negative pressure inside the via could cause the solder balls at this section to be of normal size. When warping increases throughout reflow, this negative pressure could be reversed, causing the solder to flow back into the solder ball as the BGA assembly is warping. If configured correctly, the increase in solder-ball size may correspond to the increased space between the BGA components, resulting in a proper connection despite the warpage.

For example, the amount of solder released from the via (by reducing the suction) may be based on the warpage pattern; if the warpage pattern is expected to cause a stretched solder ball if the solder ball is smaller than a threshold percentage (e.g., 120%) of its prescribed pre-warpage size, the solder ball may initially be applied with to the via with extra solder (e.g., 30% extra). The vacuum may draw in the extra solder (e.g., 30%) upon reflow melting, returning the solder ball to its prescribed, pre-warpage size. During warping, however, some of that suction may be reduced, causing some of the solder to return to the solder ball. In this example, the vacuum head may reduce suction enough to release at least 66% of the solder in the via, causing the solder to grow to 120% of its pre-warpage size (i.e., the threshold percentage).

As discussed above, the application of suction to BGA vias to mitigate reflow warpage may function optimally when the amount of suction at a particular via is tuned for the amount of warpage at that particular via. However, while warpage of a BGA assembly can be predicted with some accuracy, warpage during reflow can differ from assembly to assembly, and can be less predictable in new BGA assembly designs. For this reason, some embodiments of the present disclosure may apply extra solder at each via of a BGA connection, and draw some of that solder into each via. These embodiments may then analyze the warpage patterns of a BGA assembly during reflow, and apply more suction to each via if warpage creates less space than expected between the BGA components, or apply less suction to each via if warpage creates more space than expected between the BGA components. In this way, some embodiments of the present disclosure may take advantage of the extra solder applied before reflow to adjust solder-ball size due to deviations in the expected warpage pattern of the BGA components.

Some embodiments of the present disclosure may also apply suction during reflow to customize the features that are populated in the finished BGA assembly. For example, a BGA assembly design may include a processor that is attached to a motherboard PCB. The company that manufactures and sells the BGA assembly may desire to sell multiple versions of the BGA assembly each of which may have different populated features. It may be possible to manufacture BGA-assembly versions with multiple features by developing multiple processor-die designs, and installing a particular processor die on in a BGA assembly depending on the particular version being produced. Unfortunately, this typically increases design cost of creating the processor dies, storing multiple versions of the processor dies, maintaining records of multiple processor dies, and developing the different processes by which the different dies are attached to a BGA assembly.

However, using embodiments of the present disclosure, a single processor die could be created for multiple versions of the BGA assembly. When a particular version is being manufactured, the features, if any, that are not included in that version can be identified. For example, a particular processor may not have overclocking ability or may have several cores deactivated. Once those features are identified, the BGA connections between the motherboard PCB and the processor that enable those features may also be identified, in addition to the locations of the solder balls, and corresponding vias, that form those connections. By applying suction at those corresponding vias during reflow, the solder balls that form the electrical connections on which those features rely may be significantly sucked into the vias, preventing those features from being populated on that BGA assembly. Thus, in addition mitigating the effects of BGA assembly warpage, embodiments of the present disclosure may also enable customization of BGA assembly versions without the cost of creating and maintaining multiple BGA components and assembly-manufacturing processes.

FIG. 1A depicts a first view of a ball-grid-array assembly 100 before reflow has begun. Ball-grid-array assembly 100 (also referred to herein as "BGA assembly 100") features a die 102 (e.g., a processor die, a RAM die) that has been attached to a printed circuit board 104 (also referred to herein as "PCB 104") with four layers 106, 108, 110, and 112. Die 102, together with PCB 104, form one BGA component of BGA assembly 100. Die 102 and PCB 104 are attached to a second BGA component, PCB 114. PCB 114 may be, for example, a motherboard PCB. The two BGA components of BGA assembly 100 are, as illustrated, temporarily connected with solder balls in a ball grid array, such as solder balls 116, 118, 120, and 122. This connection is temporary because, while the resin inside the solder balls causes a tacky structural connection between the BGA components, reflow has not melted the solder balls to cause a permanent structural and electrical connection. As illustrated, each solder ball in BGA assembly 100 is placed upon a via that spans the height of PCB 114, such as via 124, on which solder ball 116 is placed.

Prior to reflow, BGA assembly 100 may be analyzed to predict the likely warping pattern of each BGA component (i.e., of die 102 and PCB 104 and of PCB 114) and the resulting effects on the solder balls that form the connection between the BGA components. For example, due to its relative uniformity and size, PCB 114 may be predicted to not warp significantly between the locations of solder balls 116-122. However, PCB 104 has four layers 106 through 112, each of which may be a slightly different thickness (these differences not illustrated in FIG. 1A). Further, layers 106 through 110 are each illustrated with regions of particularly high copper density (regions 126, 128, and 130). Further, layer 112 may have a particularly thick copper wire 132 attached to its substrate.

All these identified design properties of PCB 104 may normally require expensive design alterations to avoid the risk of warping that they introduce. For example, if the thicknesses of layers 106 through 112 increase the risk of warping, the substrates of PCB 104 may be altered such that layers 106 through 112 would exhibit vertical symmetry (i.e., layers 106 and 112 would be of the same thickness and layers 108 and 110 would be of the same thickness). Similarly, unconnected copper may be inserted at specific regions of layers 106 though 110 (i.e., copper thieving) to compensate for the high density of copper in regions 126 through 130. Finally, the copper wires in layers 106 though 110 may be increased to equal the thickness of copper wire 132.

However, using the embodiments of the present disclosure, suction can be applied to the vias of PCB 114 to mitigate the effects of PCB 104 warping during reflow. This may avoid the necessity to redesign PCB 104, potentially saving significant time and resources. For example, as illustrated, a vacuum head is attached to each via of PCB 114. For example, vacuum head 134 is attached to via 124. While, as illustrated, each via of PCB 114 is outfitted with a separate vacuum head, other embodiments of the present disclosure may utilize fewer vacuum heads. There may be, as will be illustrated, benefits to outfitting each via with an independent vacuum head, this may also increase cost. Thus, in some embodiments, some vias may share a single vacuum head (for example, a square grid of 4 vias may all share one larger vacuum head). Further, some embodiments may feature one or more vacuum heads on repositionable arms that are capable of moving the vacuum heads to the vias at which suction is necessary.

Figure 1B:
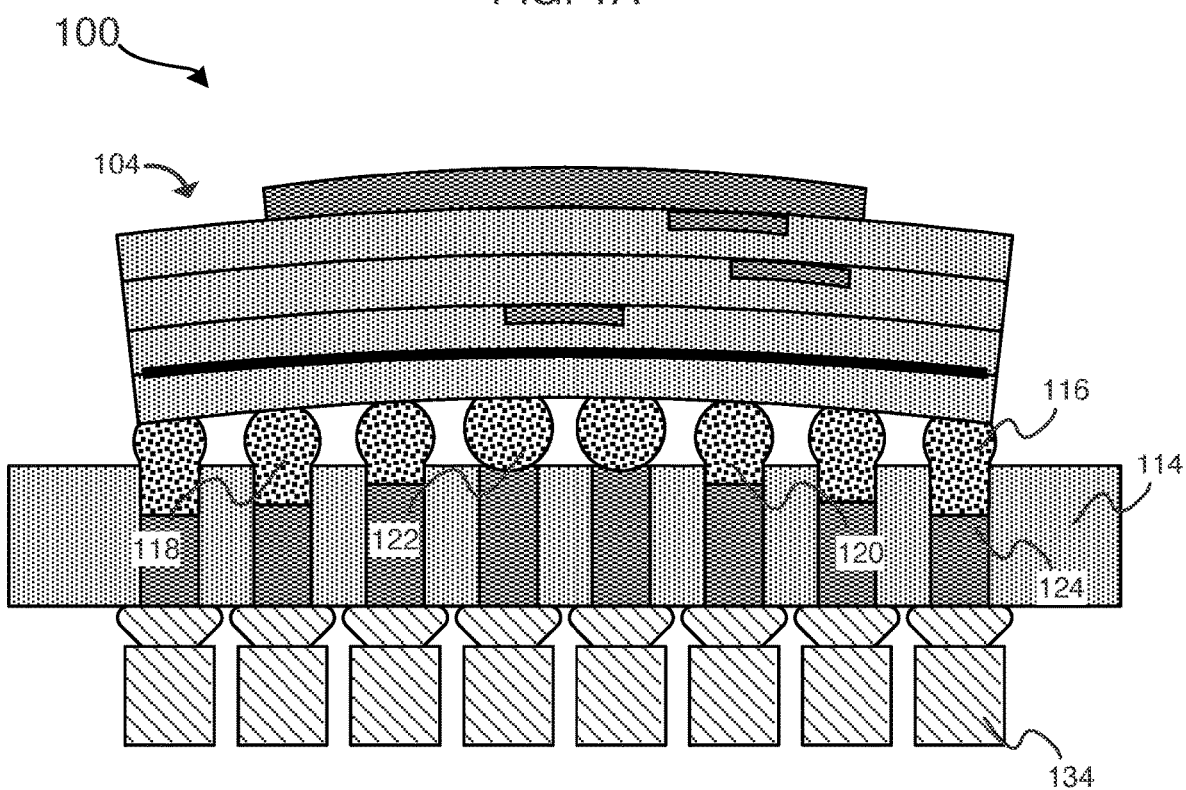
FIG. 1B depicts a second view of the ball-grid-array assembly during vacuum compensation for reflow warpage.

The use of vacuum heads to mitigate the reflow warping of PCB 104 is illustrated in FIG. 1B. FIG. 1B illustrates PCB 104 in a warped state, causing the edges of PCB 104 to be pulled significantly closer to PCB 114 than before reflow. This may normally cause solder balls 116 and 118, for example, to become squished in the reduced space between PCB 104 and PCB 114, potentially to the extent at which they may connect with neighboring solder balls, forming electrical shorts. This effect is greatest at the edge of PCB 104, and is not significant in the middle of PCB 104 (i.e., at the location of solder ball 122). Thus, as illustrated, the vacuum heads attached to PCB 114's vias have increased the suction of those vias according to the warping pattern.

For example, vacuum head 134, because solder ball 116 is at the edge of PCB 104, has drawn a large amount of solder into via 124, causing solder ball 116 to shrink. The vacuum head below solder ball 118 has also increased the suction in the via, but less so than vacuum 134. This is because the BGA 100's warping pattern was predicted to result in more space between PCB 104 and PCB 114 at solder ball 118's location, as compared to solder ball 116's location. Similarly, even less of solder ball 120 has been drawn into the via, and none of solder ball 122 has been drawn into the via. This may be because reflow warping was not predicted to affect solder ball 122, and thus the vacuum head corresponding to solder ball 122 did not apply suction to the corresponding via.

As illustrated in FIGS. 1A and 1B, no excess solder was applied and drawn into PCB 114's vias prior to reflow. This is illustrated particularly by the fact that solder ball 122 is in the same shape before and during reflow. However, in some embodiments it may be beneficial to apply excess solder before reflow. For example, if PCB 104 were warping away from PCB 114 in the center, solder ball 122 may begin to stretch or may even disconnect from one of PCB 114 or PCB 104. In this instance, being able to release solder from the corresponding via to increase the size of solder ball 122 may keep it from developing a BGA defect.

As discussed, the suction pattern utilized in FIG. 1B may have been mainly based on a predicted warping pattern of BGA assembly 100. However, in some embodiments the same, or similar, methods that were used to predict warping patterns may be used to analyze the warping patterns in real time during reflow, and adjust the applied suction pattern if necessary. This may be helpful, for example, when manufacturing new BGA assembly designs for which accurate warping predictions do not yet exist.

Figure 2:
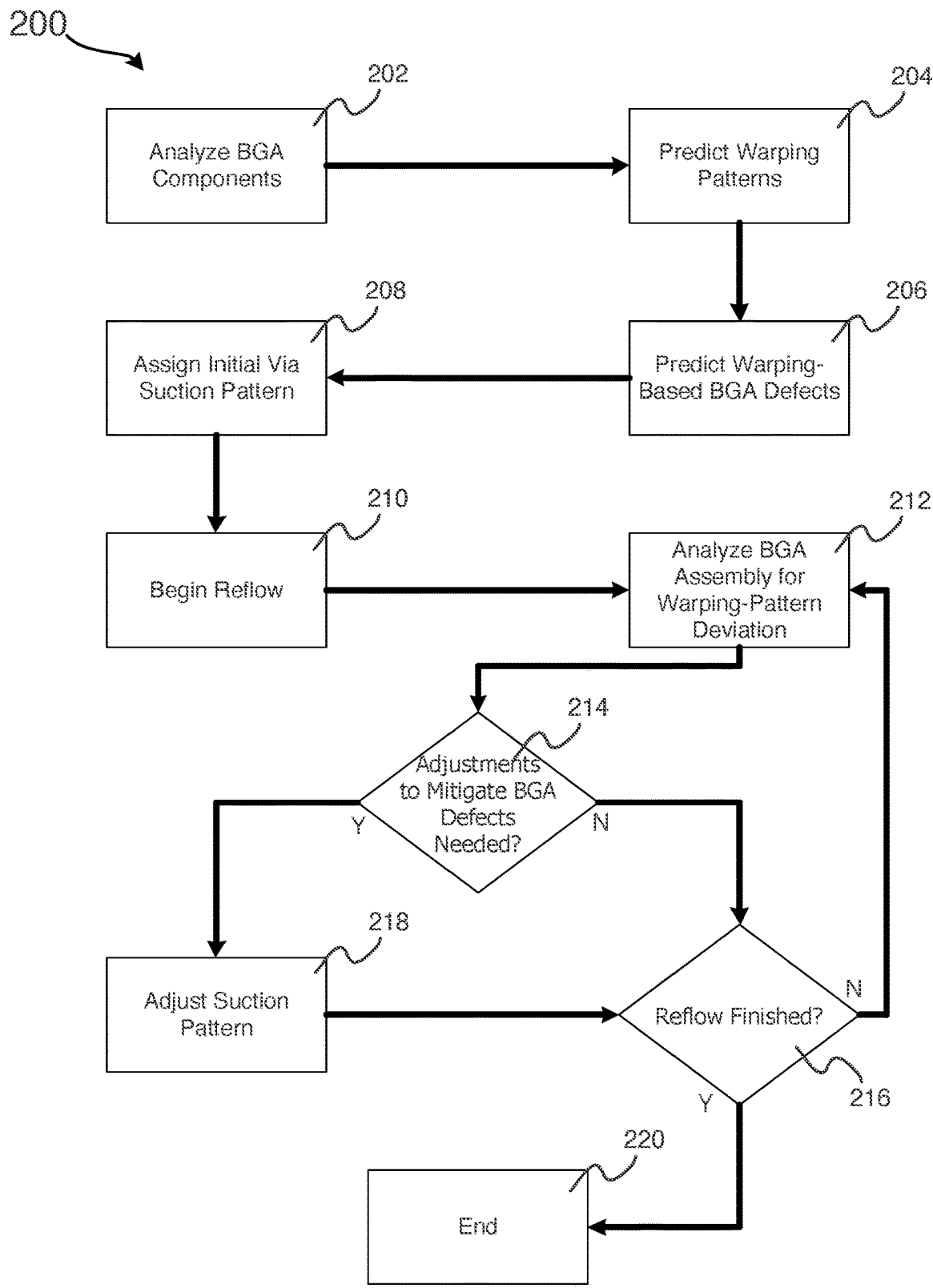
FIG. 2 depicts a method of compensating for reflow warpage using one or more via-attached vacuums, in accordance with the embodiments of the present disclosure.

FIG. 2 depicts a method 200 of compensating for reflow warpage using one or more via-attached vacuums, in accordance with the embodiments of the present disclosure. Method 200 may be performed by or with the help of a computer system designed to mitigate the effects of reflow warping, such as computer system 601. Method 200 may be performed on BGA assemblies, such as BGA assembly 100 of FIGS. 1A and 1B. In this way, the properties of a BGA assembly that may normally need to be altered to prevent warping may be maintained in the BGA assembly without risking BGA defects as a result of that warping. This added flexibility to cope with reflow warping may, as a result make designing BGA assemblies more flexible and forgiving, saving time and resources.

Method 200 begins with block 202, in which the BGA components of a BGA assembly are analyzed. In typical use cases this involves analyzing one or more printed circuit boards, but in some use cases it may involve analyzing other BGA components, such as a solid-state-drive storage die. In block 204, warping patterns of the BGA assembly are predicted based on the analysis of the BGA components. For example, block 202 discovers that a BGA component is a PCB with significantly uneven copper density, that BGA component may be predicted to expand unevenly due to that uneven copper density, resulting in a predicted warping pattern.

Once a warping pattern for a BGA assembly is predicted, the solder-ball defects that may result from that warping pattern are predicted in block 206. For example, if a warping pattern predicted in block 204 suggests that the two BGA components will be pushed together at a particular location, block 206 may include predicting that the solder balls at that location may become squished and contact each other, resulting in electrical shorts between those solder balls. This prediction may be based both on the expected amount of warping, and the distance between the solder balls in the array (i.e., the ball pitch of the BGA).

Similarly, if a warping pattern predicted in block 204 suggests that the two BGA components will be pulled apart at a particular location, block 206 may include predicting that the solder balls at that location may become stretched, or even disconnected from one of the BGA components.

The BGA defects predicted at block 206 may be analyzed to assign an initial via-suction pattern in block 208. The initial via suction pattern may, for example, attempt to apply extra suction at vias that correspond to solder balls that are likely to bridge with neighboring solder balls. This could draw some of those solder balls into the vias, shrinking the solder balls and preventing bridging. Similarly, the initial suction pattern may attempt to apply less suction at vias that correspond to solder balls that are likely to become stretched between the two BGA components. This could release some solder that had previously been drawn into a corresponding via, increasing the size of the solder balls and preventing stretching.

Once the initial suction pattern is assigned in block 208, reflow is begun in block 210. In typical embodiments, block 210 may include monitoring the temperature of the BGA assembly, individual BGA components, or even the BGA solder balls and applying suction to the BGA assembly vias when that temperature is sufficiently high for solder to melt. In other words, block 210 may include determining when the BGA assembly solder balls are warm enough to be drawn into the vias, and apply suction to the vias based on the initial via suction plan when that occurs.

In some instances, this initial suction pattern assigned in block 208 and applied in block 210 may be sufficient to mitigate the warping-based BGA defects that were predicted in block 206. However, in some instances, such as with newly designed BGA assemblies for which manufacturing data is sparse, the actual warping patterns during reflow may deviate from the warping patterns that were predicted during block 204. In these instances, the BGA defects that result from the actual reflow warping may differ from the BGA defects predicted at block 206, and may therefore require different suction patterns.

For this reason, method 200 includes analyzing, in block 212, the BGA assembly for warping patterns that deviate from the warping patterns that were predicted in block 204. This may be performed, for example, by analyzing the BGA components using laser time-of-flight analysis to determine the real-time warping patterns of each BGA component. With this analysis, method 200 also includes determining, in block 214, whether adjustments to the suction pattern are necessary to mitigate the BGA defects that may occur due to the warping detected in block 212. If no adjustments are needed, block 214 proceeds to block 216, in which a system performing method 200 may determine whether reflow has finished. This may include, for example, determining whether a minimum threshold amount of time above a minimum threshold temperature has passed.

If reflow has not finished, block 216 proceeds back to block 212, in which the real-time warping pattern is continuously analyzed for deviations form the patterns predicted in block 204. If, in block 214, it is determined that adjustments to the suction pattern are needed to mitigate the potential BGA defects that could result from those warping-pattern deviations, block 214 proceeds to block 218, in which the suction pattern (e.g., the suction pattern assigned in block 208) is adjusted to account for the warping pattern deviation that was analyzed in block 212. Once the suction is adjusted, the system performing method 200 determines whether reflow has finished. If it has, method 200 ends in block 220.

Figure 3A:
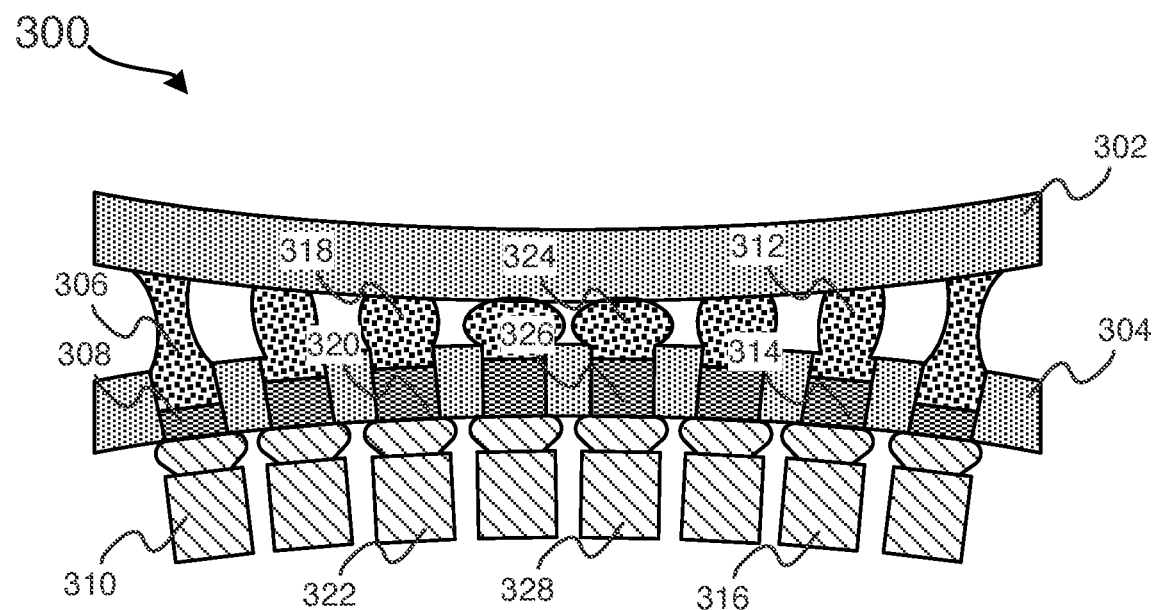
FIG. 3A depicts a first view of a ball-grid-array assembly warping during reflow.
Figure 3B:
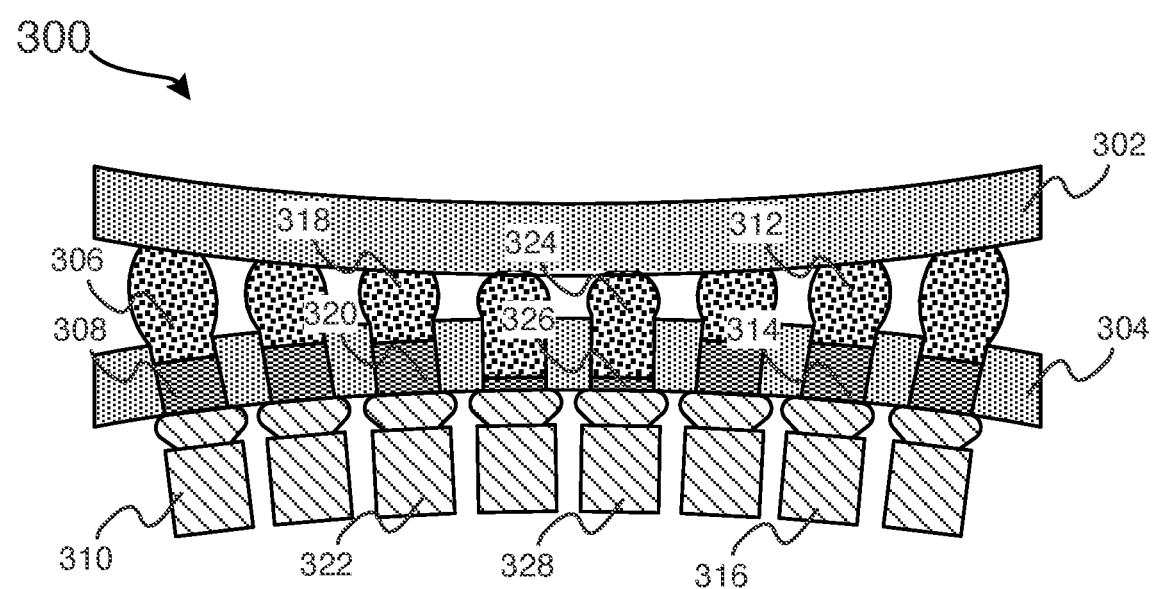
FIG. 3B depicts a second view of the ball-grid-array assembly after vacuum compensation was adjusted to account for the warpage during reflow.

To aid in understanding, FIGS. 3A and 3B depict an adjustment to a suction pattern during reflow of a BGA assembly 300, in accordance with embodiments of the present disclosure. The adjustments shown between FIGS. 3A and 3B may occur, for example, as a result of a computer system (such as computer system 601) practicing blocks 212 through 218 during real-time reflow. Of note, the warping of BGA assembly and corresponding suction adjustments depicted in FIGS. 3A and 3B have been exaggerated for the sake of understanding, but may, in theory, also represent some instances in which a mistake was made when predicting warping of one or more BGA components of a BGA assembly.

FIG. 3A depicts a first view of BGA assembly 300 warping during reflow. BGA assembly includes BGA component 302 that is being attached to BGA component 304. BGA component 304 includes vias onto which the solder balls of the ball grid array have been placed. Solder ball 306, for example, is spanning the distance between BGA components 302 and 304 and has been partially drawn in to via 308 using vacuum head 310. Similarly, solder ball 312 has been partially drawn in to via 314 using vacuum head 316, solder ball 318 has been partially drawn into via 320 using vacuum head 322, and solder ball 324 has been partially drawn into via 326 using vacuum head 328.

As illustrated, the suction pattern that has been applied in FIG. 3A appears to be insufficient to mitigate the warpage of BGA components 302 and 304. For example, solder ball 306 appears very stretched, causing the cross-sectional area of solder ball 306 through which electrical signals could be sent to be reduced. Further, if the warping illustrated in FIG. 3A continues, solder ball 306 may completely disconnect from BGA component 302. While this is less true for solder ball 312, it appears that it is also being stretched, causing the contact area between solder ball 312 and BGA component 302. Solder ball 324, however, has been significantly squished by BGA components 302 and 304, causing a risk that solder ball 324 contacts one of its neighboring solder balls, resulting in an electrical short.

FIG. 3B depicts a second view of BGA assembly 300 after vacuum suction pattern was adjusted to account for the deviation between predicted warpage and real-time warpage observed during reflow. For example, vacuum head 310 has decreased the suction applied to via 308, causing some of the solder therein to be drawn back out into solder ball 306. As a result, solder ball 306 no longer is being stretched, and appears to be making good contact.

Similarly, vacuum head 316 has also decreased suction applied to via 314, causing some of the solder therein to be drawn back out into solder ball 312. This has also increased the diameter and surface area of solder ball 312 to acceptable levels. However, because solder ball 312 is father from the edges of BGA components 302 and 304, where a majority of warping occurs, a smaller adjustment to the suction applied by vacuum head 316 may have been applied to via 314 than was applied to via 308.

Further, as illustrated, FIG. 3B depicts no change in the suction applied by vacuum head 322, and thus solder ball 318 also remains unchanged. This may be because the actual warpage that is occurring at solder ball 318 may be sufficiently similar to the predicted warpage to make adjustments unwarranted.

Finally, as illustrated, a significant adjustment has been made to the suction applied by vacuum head 328. In order to mitigate the warpage patterns that were pushing solder ball 324 into its neighbors, vacuum head 328 drew a significant amount of solder ball 324 into via 326, reducing the diameter of solder ball 324 to an acceptable level.

As discussed previously, some embodiments of the present disclosure can be used to mitigate the risk of BGA defects that may result from reflow warpage. However, some embodiments of the present disclosure may also be used to depopulate features of a BGA assembly by drawing the solder balls that enable the electrical features into the vias of a BGA component. By identifying the solder balls that form the electrical connections on which those features rely, the solder balls can be drawn into the via, preventing those electrical connections from forming. This may provide an inexpensive, simple way of depopulating a feature of a BGA assembly without requiring the design and development of multiple BGA components or manufacturing processes.

Figure 4:
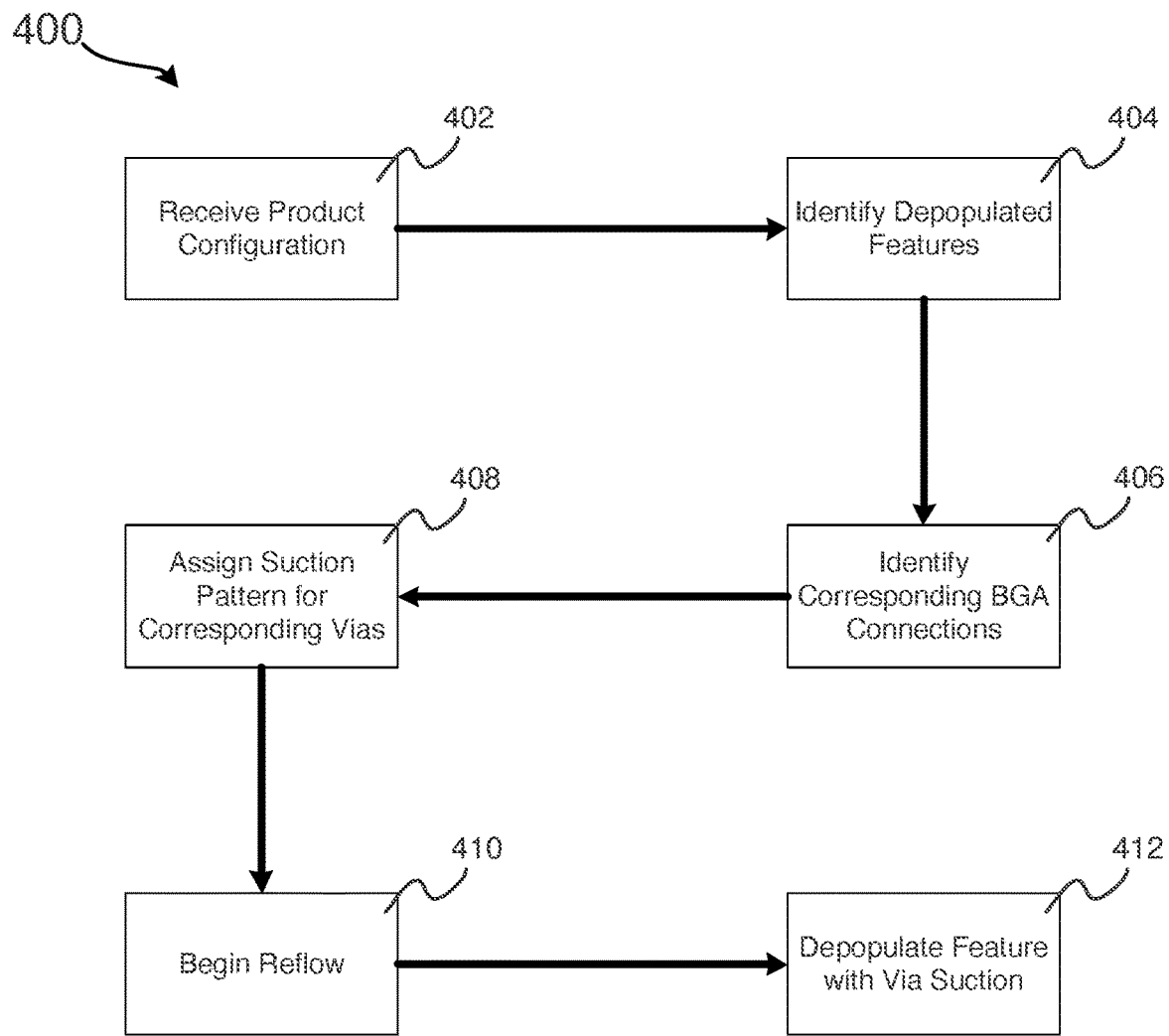
FIG. 4 depicts a method of depopulating a product feature in a ball-grid-array assembly using one or more via-attached vacuums, in accordance with embodiments of the present disclosure.

FIG. 4 depicts a method 400 of depopulating a product feature in a ball-grid-array assembly using one or more via-attached vacuums, in accordance with embodiments of the present disclosure. Method 400 may be utilized, for example, in a manufacturing process in which one of several product configurations of BGA assemblies may be produced based on the features that are included in those product configurations. Method 400 may be performed, for example, by a computer system, such as computer system 601, that is designed to automate the production of multiple configurations of BGA assemblies.

Method 400 begins in block 402, in which a product configuration of a BGA assembly to be produced is received. For example, the BGA assembly may be a processor mounted on a motherboard. In this example, a first product configuration may enable a particular data-transfer protocol in the processor, and a second product configuration may have that data-transfer protocol disabled (i.e., may have the feature depopulated). Similarly, a first product configuration may enable all cores of the processor, and a second configuration may disable a set of processor cores.

With the product configuration received in block 402, a list of features to be depopulated from a base configuration (e.g., a configuration with all features populated) can be identified in block 404. For example, block 404 may identify that 2 processor cores and simultaneous multithreading should be depopulated in the product configuration. Once the list of depopulated features is identified in block 404, a set of BGA connections (i.e., solder balls that form connections between two BGA components) that correspond to those depopulated features is identified in block 406. For example, a computer performing method 400 may determine that the features identified in block 404 require a set of pins on the processor to be powered. The computer may then determine the BGA connections that supply power to those pins from the motherboard.

Once the BGA connections that correspond to the identified features are identified in block 406, a suction pattern for the vias below those BGA connections is assigned in block 408. In some embodiments, this may include identifying one or more vacuum heads that could be used to draw the solder balls that form those BGA connections into the vias. Block 408 could also include identifying a suction amount to be applied to those vias to produce a sufficient negative pressure to draw in a sufficient amount of solder to prevent the solder balls from forming an electrical connection. In some embodiments, block 408 may also take into account predicted warpage patterns of the BGA assembly. This may prevent a solder ball from forming a connection despite the procedure in method 400 due to warpage reducing the space between BGA components. In some instances, predicted warpage patterns of the BGA assembly may suggest that the solder balls will not form connections unless extra solder is added, due to the BGA components separating at that location. In these instances, a suction pattern to depopulate the feature could actually apply no suction to the corresponding vias.

Once a suction pattern is assigned in block 408, reflow is begun in block 410. As discussed, this includes heating the BGA assembly to a temperature high enough that the solder in the solder ball melts. At that point, the suction pattern that was assigned in block 408 could be used in block 412 to depopulate the features that were identified in block 404. In other words, for example, a vacuum could be applied to the vias corresponding to the BGA connections that enable the identified features, and the vacuum could be used to draw the solder for those BGA connections into the corresponding vias. This would prevent the electrical connections corresponding to those features, which would prevent the features from functioning.

Figure 5A:
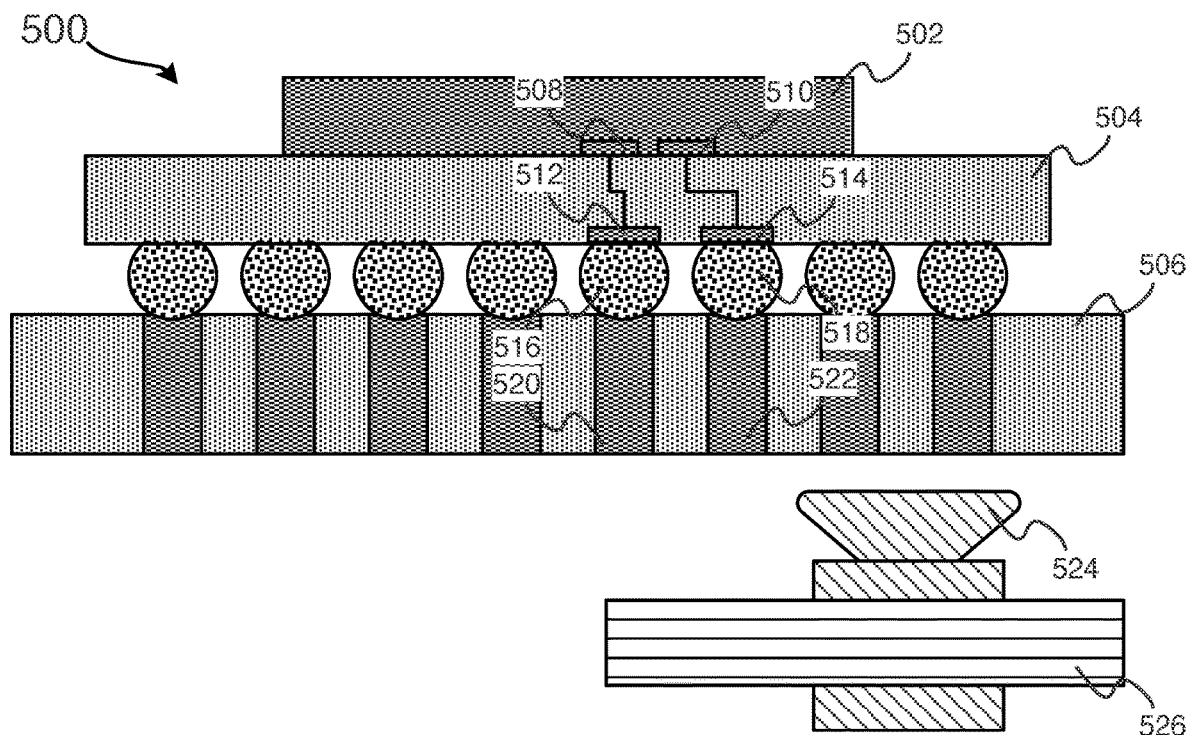
FIG. 5A depicts a first view of a ball-grid-array assembly before reflow has begun.
Figure 5B:
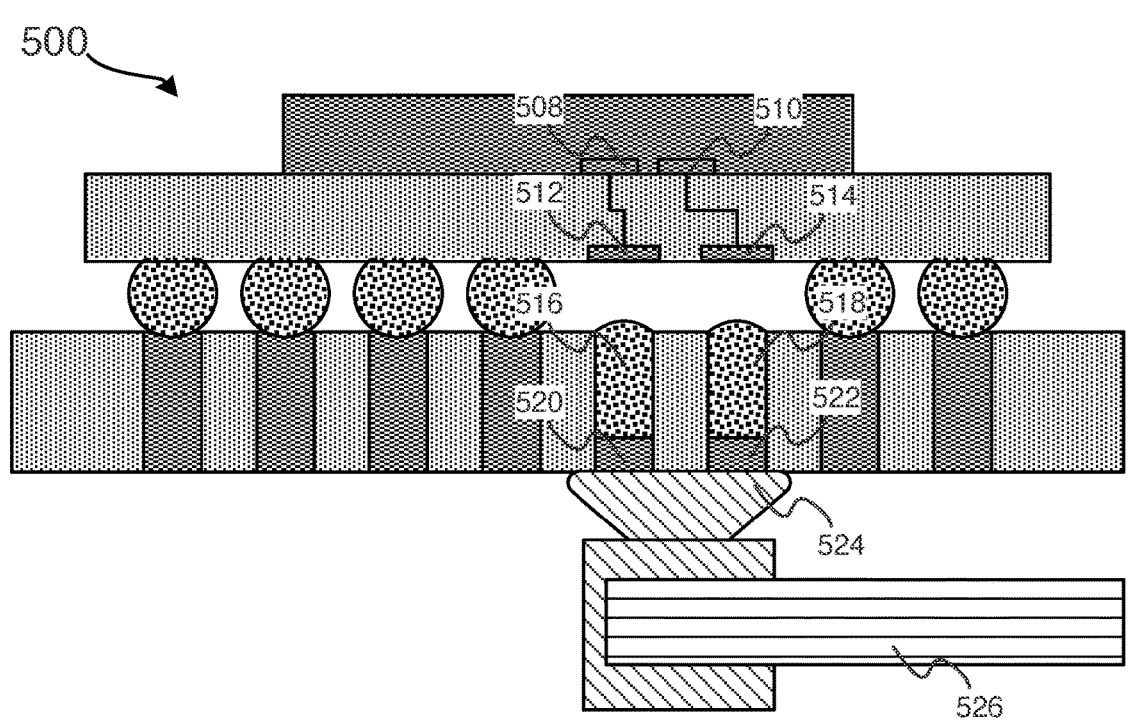
FIG. 5B depicts a second view of the ball-grid-array assembly after a via-attached vacuum has been used to depopulate a feature of the assembly.

For the sake of understanding, FIGS. 5A and 5B depict the use of suction on a set of vias in a BGA assembly 500 to depopulate a feature for that assembly. For example, FIGS. 5A and 5B could illustrate the application of method 400 to a BGA assembly.

FIG. 5A depicts a first view of BGA assembly 500 before reflow has begun. BGA assembly includes a processor die 502 that is attached to a package PCB 504. Processor die 502 is getting connected to motherboard PCB 506 through a BGA connection. The solder balls in this BGA connection may carry specific data and power that enables particular features of processor die 502 for different product configurations. For example, processor die 502 contains contacts 508 and 510. Contacts 508 and 510 may correspond to one or more features of processor die 502 that could be enabled or disabled depending on a product configuration. For example, contact 508 may provide power to boost the clock of a processor above a specified frequency, whereas contact 510 may enable simultaneous multithreading. By connecting these contacts to motherboard PCB 506, these features could be enabled. This connection would normally be formed, as illustrated, through BGA contacts 512 and 514, which are located within PCB 504 and connected to contacts 508 and 510 through, for example, copper wire and pins. In a BGA assembly product configuration in which the frequency boost and simultaneous multithreading are enabled, contacts 512 and 514 would form electrical contacts to motherboard PCB 506 though solder balls 516 and 518. These solder balls have been placed upon vias 520 and 522 respectively.

FIG. 5A also depicts a vacuum head 524 which can apply suction to the vias of motherboard PCB 506 to draw solder balls into those vias. Vacuum head 524, as depicted, is attached to a positioning arm 526, which may be able to position vacuum head 524 over any of the vias of PCB 506.

FIG. 5B depicts a second view of BGA assembly 500 after vacuum head 524 has been used to depopulate a feature of the assembly during reflow. As illustrated, vacuum head 524 has been positioned over vias 520 and 522 using positioning arm 526. Once reflow temperatures are reached, vacuum head 524 can be used to apply suction to vias 520 and 522, creating a negative pressure therein. This causes solder balls 516 and 518 to be drawn into vias 520 and 522 respectively. Once this occurs, the connections between solder balls 516 and 518 are unable to form. This, in turn, prevents contacts 508 and 510 from being powered or provided data through package contacts 512 or 514. As a result, the features connected to those contacts would not function. In this way, vacuum head 524 can be used to cheaply and effectively depopulate the features of a BGA assembly without requiring multiple BGA component versions or multiple manufacturing processes.

Figure 6:
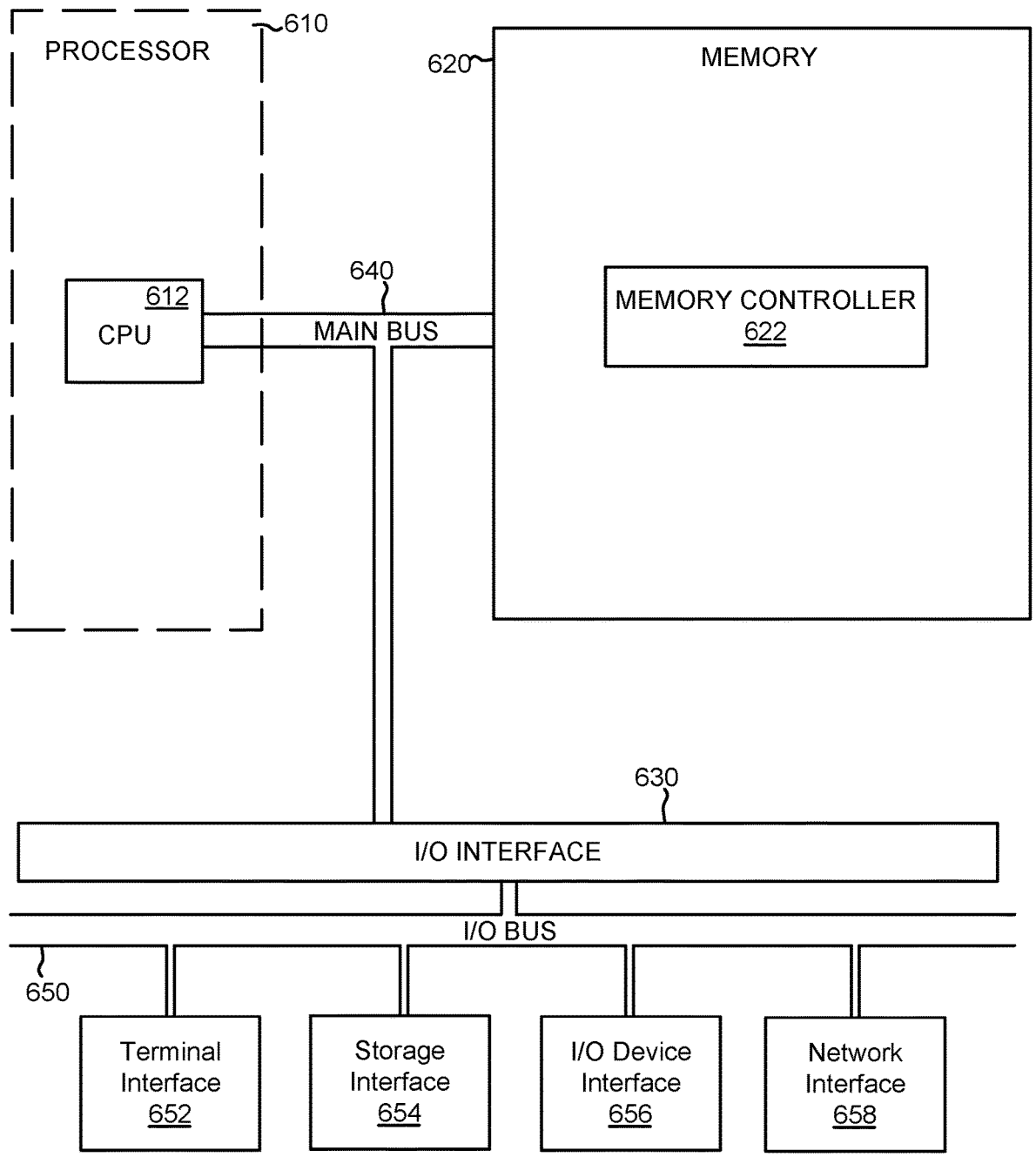
FIG. 6 depicts the representative major components of a computer system that may be used in accordance with embodiments.

FIG. 6 depicts the representative major components of an example Computer System 601 that may be used in accordance with embodiments of the present disclosure. The particular components depicted are presented for the purpose of example only and are not necessarily the only such variations. The Computer System 601 may include a Processor 610, Memory 620, an Input/Output Interface (also referred to herein as I/O or I/O Interface) 630, and a Main Bus 640. The Main Bus 640 may provide communication pathways for the other components of the Computer System 601. In some embodiments, the Main Bus 640 may connect to other components such as a specialized digital signal processor (not depicted).

The Processor 610 of the Computer System 601 may include one or more CPUs 612. The Processor 610 may additionally include one or more memory buffers or caches (not depicted) that provide temporary storage of instructions and data for the CPU 612. The CPU 612 may perform instructions on input provided from the caches or from the Memory 620 and output the result to caches or the Memory 620. The CPU 612 may include one or more circuits configured to perform one or methods consistent with embodiments of the present disclosure. In some embodiments, the Computer System 601 may contain multiple Processors 610 typical of a relatively large system. In other embodiments, however, the Computer System 601 may be a single processor with a singular CPU 612.

The Memory 620 of the Computer System 601 may include a Memory Controller 622 and one or more memory modules for temporarily or permanently storing data (not depicted). In some embodiments, the Memory 620 may include a random-access semiconductor memory, storage device, or storage medium (either volatile or non-volatile) for storing data and programs. The Memory Controller 622 may communicate with the Processor 610, facilitating storage and retrieval of information in the memory modules. The Memory Controller 622 may communicate with the I/O Interface 630, facilitating storage and retrieval of input or output in the memory modules. In some embodiments, the memory modules may be dual in-line memory modules.

The I/O Interface 630 may include an I/O Bus 650, a Terminal Interface 652, a Storage Interface 654, an I/O Device Interface 656, and a Network Interface 658. The I/O Interface 630 may connect the Main Bus 640 to the I/O Bus 650. The I/O Interface 630 may direct instructions and data from the Processor 610 and Memory 620 to the various interfaces of the I/O Bus 650. The I/O Interface 630 may also direct instructions and data from the various interfaces of the I/O Bus 650 to the Processor 610 and Memory 620. The various interfaces may include the Terminal Interface 652, the Storage Interface 654, the I/O Device Interface 656, and the Network Interface 658. In some embodiments, the various interfaces may include a subset of the aforementioned interfaces (e.g., an embedded computer system in an industrial application may not include the Terminal Interface 652 and the Storage Interface 654).

Logic modules throughout the Computer System 601—including but not limited to the Memory 620, the Processor 610, and the I/O Interface 630—may communicate failures and changes to one or more components to a hypervisor or operating system (not depicted). The hypervisor or the operating system may allocate the various resources available in the Computer System 601 and track the location of data in Memory 620 and of processes assigned to various CPUs 612. In embodiments that combine or rearrange elements, aspects of the logic modules' capabilities may be combined or redistributed. These variations would be apparent to one skilled in the art.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method comprising:
predicting a solder ball ball-grid-array defect that could occur during reflow of a ball- grid-array assembly;
assigning an initial via suction pattern to mitigate the solder ball ball-grid-array defect;
applying a vacuum head to a via in the ball-grid-array assembly, wherein a solder ball is located at the opposite end of the via; and
applying a first amount of suction to the via and a second amount of suction to a second via in the ball-grid-array assembly based on the initial via suction pattern, wherein the first amount of suction draws a portion of the solder ball into the via during reflow and wherein the first amount of suction does not equal the second amount of suction.

2. The method of claim 1, further comprising:
analyzing, during reflow, a real-time warping pattern of the ball-grid-array assembly;
adjusting, based on the real-time warping pattern, the initial via suction pattern, resulting in an updated via suction pattern; and
applying a third amount of suction to the via based on the updated via suction pattern.

3. The method of claim 2, wherein applying the third amount of suction to the via based on the updated via suction pattern comprises reducing the suction applied to the via from the first amount to the third amount.

4. The method of claim 1, further comprising:
applying, before reflow, extra solder to the solder ball before reflow;
drawing the extra solder into the via during reflow; and
releasing, during reflow, a portion of the extra solder from the via.

5. The method of claim 1, further comprising:
analyzing a ball-grid-array component of the ball-grid-array assembly prior to reflow; and
predicting, based on the analyzing, a predicted warping pattern of the ball-grid-array component that is likely to occur during reflow;
wherein the solder ball ball-grid-array defect is predicted to be caused by the predicted warping pattern.

6. The method of claim 5, wherein the predicted warping pattern includes a reduced space between the ball-grid-array component and a printed circuit board, and wherein the assigning comprises:
determining that the warpage pattern is expected to cause a short if the solder ball is larger than a threshold percentage of its original size.

7. The method of claim 5, wherein the predicted warping pattern includes an increased space between the ball-grid-array component and a printed circuit board, and wherein the assigning comprises:
determining that the warpage pattern is expected to cause a short if the solder ball is smaller than a threshold percentage of its prescribed pre-warpage size;
wherein the initial suction plan comprises reducing, during reflow, the first amount of suction to release a sufficient amount of solder to the solder ball for the solder ball to grow to at least the threshold percentage.

8. A system comprising:
a processor; and
a memory in communication with the processor, the memory containing program instructions that, when executed by the processor, are configured to cause the processor to perform a method, the method comprising:
predicting a solder ball ball-grid-array defect that could occur during reflow of a ball-grid-array assembly;
assigning an initial via suction pattern to mitigate the solder ball ball-grid-array defect;
applying a vacuum head to a via in the ball-grid-array assembly, wherein a solder ball is located at the opposite end of the via;
applying suction to the via based on the initial via suction pattern, wherein the suction draws a portion of the solder ball into the via during reflow;
analyzing, during reflow, a real-time warping pattern of the ball-grid-array assembly;
adjusting, based on the real-time warping pattern, the initial via suction pattern, resulting in an updated via suction pattern; and
applying suction to the via based on the updated via suction pattern.

9. The system of claim 8, wherein the method performed by the processor further comprises:
applying, before reflow, extra solder to the solder ball before reflow;
drawing the extra solder into the via during reflow; and
releasing, during reflow, a portion of the extra solder from the via.

10. The system of claim 8, wherein the vacuum head is attached to a repositionable arm.

11. The system of claim 8, wherein the method performed by the processor further comprises:
analyzing a ball-grid-array component of the ball-grid-array assembly prior to reflow; and
predicting, based on the analyzing, a predicted warping pattern of the ball-grid-array component that is likely to occur during reflow;
wherein the solder ball ball-grid-array defect is predicted to be caused by the predicted warping pattern.

12. The system of claim 11, wherein the predicted warping pattern includes a reduced space between the ball-grid-array component and a printed circuit board, and wherein the assigning comprises:
determining that the warpage pattern is expected to cause a short if the solder ball is larger than a threshold percentage of its original size.

13. The system of claim 11, wherein the predicted warping pattern includes an increased space between the ball-grid-array component and a printed circuit board, and wherein the assigning comprises:
determining that the warpage pattern is expected to cause a short if the solder ball is smaller than a threshold percentage of its prescribed pre-warpage size;
wherein the initial suction plan comprises reducing, during reflow, the first amount of suction to release a sufficient amount of solder to the solder ball for the solder ball to grow to at least the threshold percentage.

14. The system of claim 8, wherein the method performed by the processor further comprises applying a second amount of suction to a second via based on the initial via suction pattern, wherein the suction applied to the via based on the initial via suction pattern does not equal the second amount of suction.

15. A computer program product, the computer program product comprising a computer readable storage medium having program instructions embodied therewith, the program instructions executable by a computer to cause the computer to:
predict a solder ball ball-grid-array defect that could occur during reflow of a ball-grid- array assembly;
assign an initial via suction pattern to mitigate the solder ball ball-grid-array defect;
apply a vacuum head to a via in the ball-grid-array assembly, wherein a solder ball is located at the opposite end of the via; and
apply a first amount of suction to the via and a second amount of suction to a second via in the ball-grid-array assembly based on the via suction pattern, wherein the first amount of suction draws a portion of the solder ball into the via during reflow and wherein the first amount of suction does not equal the second amount of suction.

16. The computer program product of claim 15, wherein the program instructions further cause the computer to:
analyze, during reflow, a real-time warping pattern of the ball-grid-array assembly;
adjust, based on the real-time warping pattern, the initial via suction pattern, resulting in an updated via suction pattern; and
apply a third amount of suction to the via based on the updated via suction pattern.

17. The computer program product of claim 16, wherein analyzing the real-time warping pattern comprises determining a warping-pattern deviation between the real-time warping pattern and the predicted warping pattern.

18. The computer program product of claim 15, wherein the program instructions further cause the computer to:
apply, before reflow, extra solder to the solder ball before reflow;
draw the extra solder into the via during reflow; and
release, during reflow, a portion of the extra solder from the via.

19. The computer program product of claim 15, wherein the program instructions are further executable by the computer to cause the computer to:
analyze a ball-grid-array component of the ball-grid-array assembly prior to reflow; and
predict, based on the analyzing, a predicted warping pattern of the ball- grid-array component that is likely to occur during reflow;
wherein the solder ball ball-grid-array defect is predicted to be caused by the predicted warping pattern.

20. The computer program product of claim 19, wherein the predicted warping pattern includes a reduced space between the ball-grid-array component and a printed circuit board, and wherein the assigning comprises:
determining that the warpage pattern is expected to cause a short if the solder ball is larger than a threshold percentage of its original size.

* * * * *